United States Patent
Rahman et al.

(10) Patent No.: US 12,099,305 B2
(45) Date of Patent: Sep. 24, 2024

(54) RINSE AND METHOD OF USE THEREOF FOR REMOVING EDGE PROTECTION LAYERS AND RESIDUAL METAL HARDMASK COMPONENTS

(71) Applicant: Merck Patent GmbH, Darmstadt (DE)

(72) Inventors: M. Dalil Rahman, Monmouth Junction, NJ (US); Salem Mullen, Florham Park, NJ (US); JoonYeon Cho, Gyeonggi-do (KR)

(73) Assignee: Merck Patent GmbH, Darmstadt (DE)

( * ) Notice: Subject to any disclaimer, the term of this patent is extended or adjusted under 35 U.S.C. 154(b) by 456 days.

(21) Appl. No.: 17/596,906

(22) PCT Filed: Jul. 6, 2020

(86) PCT No.: PCT/EP2020/068936
§ 371 (c)(1),
(2) Date: Dec. 21, 2021

(87) PCT Pub. No.: WO2021/004985
PCT Pub. Date: Jan. 14, 2021

(65) Prior Publication Data
US 2022/0308455 A1    Sep. 29, 2022

Related U.S. Application Data (60) Provisional application No. 62/871,346, filed on Jul. 8, 2019.

(51) Int. Cl.
G03F 7/42 (2006.01)
C11D 7/26 (2006.01)
H01L 21/02 (2006.01)

(52) U.S. Cl.
CPC .............. *G03F 7/426* (2013.01); *C11D 7/263* (2013.01); *C11D 7/265* (2013.01); *H01L 21/02087* (2013.01); *C11D 2111/22* (2024.01)

(58) Field of Classification Search
CPC .......... G03F 7/426; G03F 7/091; G03F 7/422; G03F 7/425; C11D 7/263; C11D 7/265; C11D 2111/22; H01L 21/02087
See application file for complete search history.

(56) References Cited

U.S. PATENT DOCUMENTS 5,612,303 A * 3/1997 Takayanagi ............... C09D 7/20
134/40
5,695,571 A * 12/1997 Watanabe ............... B23K 1/203
134/28

(Continued)

FOREIGN PATENT DOCUMENTS

EP    0566286 A1    10/1993
EP    1193557 A1    4/2002

(Continued)

OTHER PUBLICATIONS

JP-3924910-B2, Machine Translation. (Year: 2024).*

(Continued)

*Primary Examiner* — Duy Vu N Deo
*Assistant Examiner* — Christopher Remavege
(74) *Attorney, Agent, or Firm* — William T. Slaven, IV (57) ABSTRACT

The disclosed subject matter relates to a rinse and methods of use thereof for removing an edge protection layer and residual hardmask components (e.g., metals) from the edge and at least one proximate surface of a wafer/substrate where the rinse includes acetic acid and/or a halogenated acetic acid of structure (A) wherein $R_1$ and $R_2$ are independently hydrogen or a halogen and $R_3$ is a halogen and (ii) a compound having structure (B) wherein each of $R_a$, $R_b$, $R_c$, $R_d$, $R_e$, $R_f$, $R_g$ and Rh may independently be hydrogen, a substituted or an unsubstituted alkyl group, a substituted or (Continued)

an unsubstituted halogenated alkyl group, a substituted or an unsubstituted alkyl carbonyl group, a halogen, and a hydroxy group.

23 Claims, 2 Drawing Sheets

(56) References Cited

U.S. PATENT DOCUMENTS

| | | | | |
|---|---|---|---|---|
| 6,250,317 | B1* | 6/2001 | Nakayama | C09D 9/00 134/38 |
| 8,791,030 | B2 | 7/2014 | Iwao et al. | |
| 10,139,732 | B2* | 11/2018 | Kawakami | G03F 7/11 |
| 10,627,719 | B2 | 4/2020 | Waller et al. | |
| 2002/0183476 | A1* | 12/2002 | Leonte | C08J 3/095 528/169 |
| 2009/0029893 | A1 | 1/2009 | Koshiyama et al. | |
| 2016/0032227 | A1* | 2/2016 | Mochida | C11D 3/2086 510/175 |
| 2018/0046086 | A1 | 2/2018 | Waller | |
| 2018/0284616 | A1* | 10/2018 | Kawakami | G03F 7/422 |
| 2020/0002568 | A1* | 1/2020 | Yao | C08G 75/20 |
| 2020/0209756 | A1 | 7/2020 | Waller et al. | |

FOREIGN PATENT DOCUMENTS

| | | | | |
|---|---|---|---|---|
| JP | H6061615 | A | 8/1994 | |
| JP | 3924910 | B2* | 6/2007 | |
| JP | 2010515246 | A | 5/2010 | |
| KR | 20160016634 | A | 2/2016 | |
| TW | 201609889 | A | 3/2016 | |
| WO | 200033140 | A1 | 6/2000 | |
| WO | 2007097233 | A1 | 8/2007 | |
| WO | WO-2016104565 | A1* | 6/2016 | C11D 3/0084 |
| WO | 2018167112 | A1 | 9/2018 | |

OTHER PUBLICATIONS

WO-2016104565-A1, Machine Translation. (Year: 2024).*
Nilesh A. Mali et al: "Vapor-Liquid Equilibrium Data for Binary Mixtures of Acetic Acid + Anisole, Acetone + Anisole, and Isopropanol + anisole at Pressure 96.15 kPa", Journal of Chemical and Engineering Data, vol. 62, No. 3, Feb 15, 2017, 947-953.
PCT International Search Report and Written Opinion, PCT/EP2020/068936, Jul. 6, 2020.
Office Action issued by Korean Patent Office on Aug. 2, 2023.
Office Action issued by Taiwan Patent Office dated Feb. 22, 2024 with English Machine Translation.
Office Action received for Japanese Patent Application No. JP2022-500551 mailing date Dec. 20, 2023, 6 (7 Pages of English translation & 2 Pages of official copy).
Notice of Eligibility with cited reference issued by Singapore Patent Office on Oct. 31, 2023.

* cited by examiner

RINSE AND METHOD OF USE THEREOF FOR REMOVING EDGE PROTECTION LAYERS AND RESIDUAL METAL HARDMASK COMPONENTS

This application is a national stage application, filed under 35 U.S.C. § 371, of International Patent Application No. PCT/EP2020/068936 (filed on 6 Jul. 2020), which claims the benefit of U.S. Provisional Patent Application No. 62/871,346 (filed 8 Jul. 2019) each of which applications is incorporated herein by reference in their entirety.

BACKGROUND

Field

The disclosed subject matter relates to a rinse and the use thereof for removing an edge protection layer in lithographic patterning processes. The novel rinse is formulated to remove both the edge protection layer and residual hardmask components (e.g., metals) from a wafer/substrate surface.

Related Art

Multiple antireflective layers and hardmasks are used in advanced lithographic patterning processes. For example, in cases where a photoresist does not provide enough dry etch resistance, underlayers and/or antireflective coatings for the photoresist that act as a hardmask and are highly etch resistant during substrate etching are preferred. One approach has been to incorporate silicon, titanium, zirconium, aluminum or other metallic materials into a layer beneath the organic photoresist layer. Additionally, another high carbon content antireflective or mask layer may be placed beneath the metal containing antireflective layer to create a tri-layer of high carbon film/hard mask film/photoresist. Such layers can be used to improve the lithographic performance of the imaging process. However, metal contamination in the lithographic and etch tools, as well as cross contamination between wafers during manufacturing, can be problems that should be avoided.

One process and apparatus for reducing metal contamination during the manufacture of integrated circuit components has been described in U.S. Pat. No. 8,791,030 ("Iwao"), which is hereby incorporated herein in its entirety. According to Iwao, a masking agent is supplied to an edge of the wafer/substrate and baked to form a masking film (a.k.a. an edge protection layer ("EPL") or edge masking layer) at the edge of the wafer/substrate. A hardmask composition is then coated on the wafer/substrate and the EPL. The portion of the hardmask composition overlying the edge protection layer is removed using an edge bead remover ("EBR") and the hardmask composition is baked to form a hardmask. The EPL is then removed with an EPL removing solution. The result is a hardmask that is spaced away from the edge of the wafer/substrate, thereby reducing contamination.

Masking agents forming EPLs are described in patent application PCT/EP2018/056322 (published as WO/2018/167112) entitled "Lithographic Compositions and Methods of Use Thereof," which is incorporated herein by reference in its entirety. The compositions disclosed therein prevent metal contamination at substrate/wafer edges during the manufacture of electronic devices. As explained in PCT/EP2018/056322, it is desirable that the applied EPLs be able to be readily removed at rates enabling and/or maintaining commercially acceptable process times without having a negative or damaging effect on the hardmask (such as can occur by wet etching).

Figure 2A:
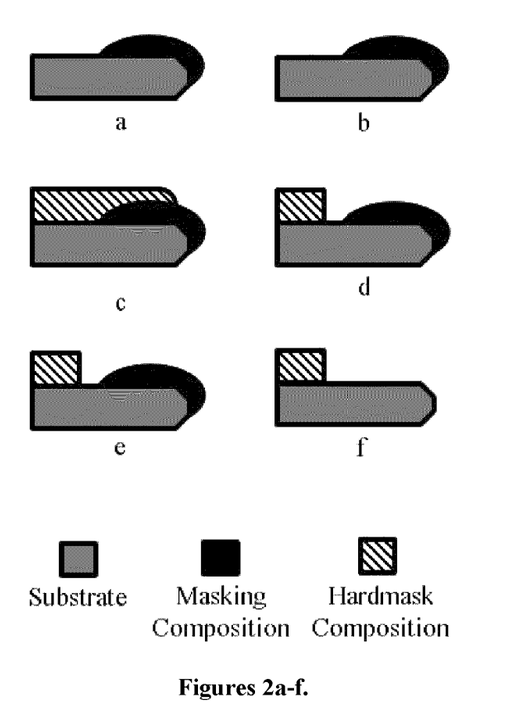
Figure 3:
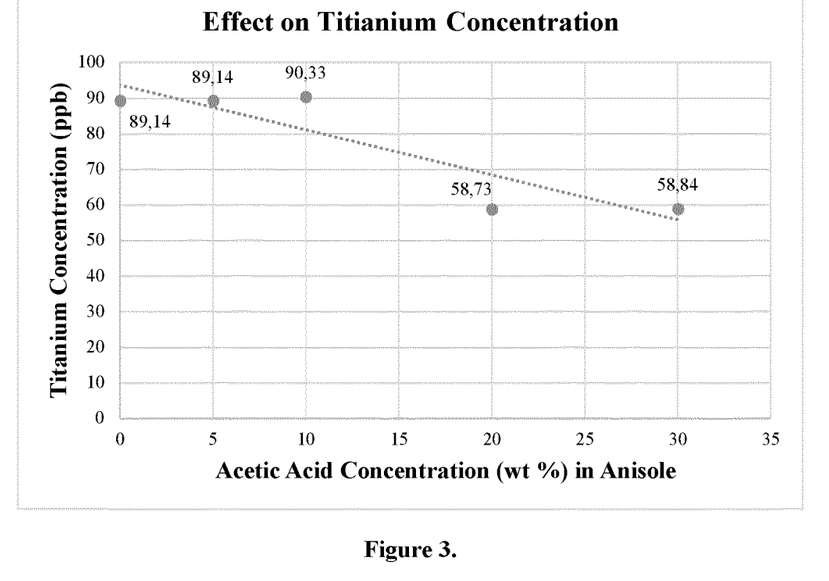
FIG. 3 is a graph illustrating residual metal (i.e., titanium) content present on the wafer/substrate surface following removal of the EPL from the edge of a wafer/substrate surface using different formulations of the disclosed rinse that includes acetic acid and anisole.
Figure 4:
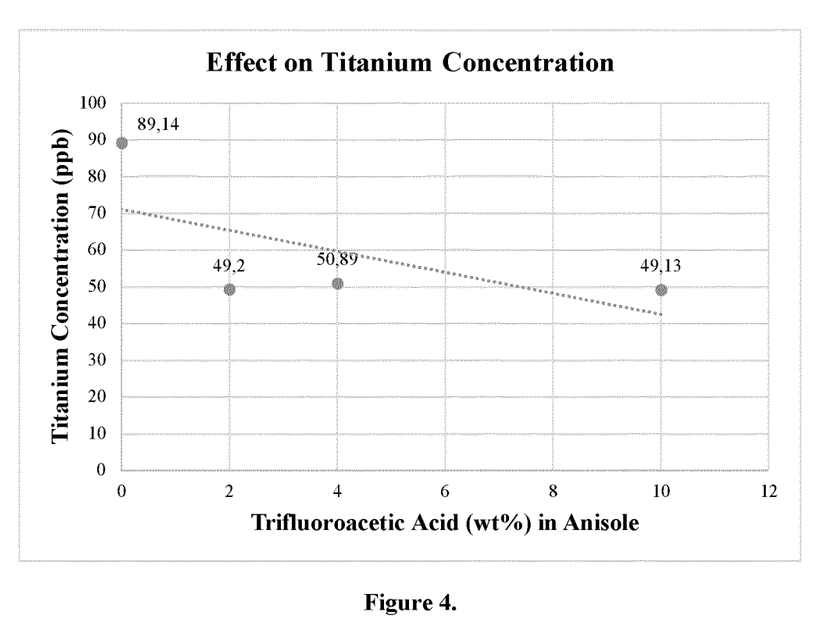
FIG. 4 is a graph illustrating residual metal (i.e., titanium) content present on the wafer/substrate surface following removal of the EPL from the edge of a wafer/substrate surface using different formulations of the disclosed rinse that includes trifluoroacetic acetic acid and anisole.

PCT/EP2018/056322 further sets forth a general process for applying a masking agent to form an EPL in a method for manufacturing an electronic device as is illustrated in FIGS. 2 a-f, herein. In such a process, a metal hardmask composition or metal oxide photoresist composition (collectively a "hardmask" or "hardmask composition") is applied onto the substrate and the EPL (see FIG. 2c). The EPL and the hardmask composition are then rinsed with an EBR and/or a backside rinse ("BR") material to remove at least a portion of the hardmask composition that is in contact with the EPL (see FIG. 2d). A portion or portions of the hardmask composition in contact with the EPL may nevertheless remain even after rinsing with an EBR or BR. The hardmask composition can, for example, partially penetrate through the EPL or undercut the edge thereof. Consequently, some quantity of the hardmask and/or its components in contact with the EPL may not be removed during the EBR rinse. To date, no compositions or processes/method have been identified providing for the simultaneous removal of both the EPL and the remaining residual components (e.g., metals) of the hardmask. Instead, the step of removing the EPL must be followed by a subsequent processing step (e.g., rinsing with additional EBR) in which any remaining residual components of the hardmask are removed from the edge and proximate surfaces of the wafer/substrate. This additional step is both costly and time consuming, and thus inconsistent with enabling and/or maintaining commercially acceptable process times when an EPL is utilized.

Accordingly, there is a continued need for materials capable of removing EPLs and any remaining residual components of the hardmask at faster rates than the known EPL rinses while avoiding negative or damaging effects on the hardmask. As discussed below, the disclosed subject matter addresses the shortcomings known in the art pertaining to the removal of an EPL and any remaining residual components of the hardmask. The disclosed subject matter provides compositions and manufacturing methods and processes for the quick and efficient removal of an applied EPL and the remaining hardmask components and residues from the edge and proximate surfaces of the wafer/substrate.

SUMMARY

In one aspect, the disclosed subject matter relates to a rinse for removing an EPL and residual hardmask components (e.g., metals such as tin or titanium) from the edge of a wafer/substrate surface in lithographic processes where the rinse includes (i) between approximately 15% by weight and approximately 35% by weight of acetic acid and (ii) between approximately 85% by weight and approximately 65% by weight of a compound having structure B:

wherein each of $R_a$, $R_b$, $R_c$, $R_d$, $R_e$, $R_f$, $R_g$ and $R_h$ may independently be hydrogen, a substituted or an unsubstituted alkyl group, which is preferably a $C_{1-6}$ alkyl group, a substituted or an unsubstituted halogenated alkyl group, which is preferably a halogenated $C_{1-6}$ alkyl group, a substituted or an unsubstituted alkyl carbonyl group, which is preferably a $C_{1-6}$ alkyl carbonyl group, a halogen, and a hydroxy group. In a further aspect, the compound having structure B is anisole (i.e., where each of $R_a$, $R_b$, $R_c$, $R_d$, $R_e$, $R_f$, $R_g$ and $R_h$ in structure B is hydrogen).

In another aspect, the disclosed subject matter relates to a rinse for removing an EPL and residual hardmask components (e.g., metals such as tin or titanium) from the edge of a wafer/substrate surface in lithographic processes where the rinse includes:

(i) between approximately 1% by weight and approximately 10% by weight of halogenated acetic acid of structure A:

wherein $R_1$ and $R_2$ are independently hydrogen or a halogen and $R_3$ is a halogen; and

(ii) between approximately 99% by weight and approximately 90% by weight of a compound having structure B:

wherein each of $R_a$, $R_b$, $R_c$, $R_d$, $R_e$, $R_f$, $R_g$ and $R_h$ is independently a hydrogen, a substituted or an unsubstituted alkyl group, which is preferably a $C_{1-6}$ alkyl group, a substituted or an unsubstituted halogenated alkyl group, which is preferably a halogenated $C_{1-6}$ alkyl group, a substituted or an unsubstituted alkyl carbonyl group, which is preferably a $C_{1-6}$ alkyl carbonyl group, a halogen, and a hydroxy group. In a further aspect, the compound having structure A is trifluoroacetic acid (i.e., where each of $R_1$, $R_2$ and $R_3$ in structure A is fluorine) or difluoroacetic acid (i.e., where $R_3$ and one of $R_1$ and $R_2$ is fluorine and the other of $R_1$ and $R_2$ is hydrogen). In yet a further aspect, the compound having structure B is anisole (i.e., where each of $R_a$, $R_b$, $R_c$, $R_d$, $R_e$, $R_f$, $R_g$ and $R_h$ in structure B is hydrogen).

In another aspect, the rinse is particularly effective at removing an EPL formed from the masking agents described and/or claimed in PCT/EP2018/056322 and residual hardmask components (e.g., metals such as tin or titanium) from the edge and proximate surfaces of a wafer/substrate surface in lithographic processes. In a further aspect, the rinse solution is particularly effective for removing an EPL formed from the masking agents described and/or claimed in PCT/EP2018/056322. In yet a further aspect, the masking agent is a masking agent described and/or claimed in PCT/EP2018/056322 where the masking agent includes a polymer unit having one or more of the following formulae:

a.

b.

c.

, and d.

In another aspect, the rinse includes (i) between approximately 15% by weight and approximately 35% by weight of acetic acid and (ii) between approximately 85% by weight and approximately 65% by weight of anisole and/or a compound having structure B. In another aspect, the rinse includes (i) approximately 15% by weight of acetic acid and (ii) preferably approximately 85% by weight of anisole and/or a compound having structure B.

In another aspect, the rinse includes (i) approximately 20% by weight of acetic acid and (ii) preferably approximately 80% by weight of anisole and/or a compound having structure B. In another aspect, the rinse includes (i) approximately 25% by weight of acetic acid and (ii) preferably approximately 75% by weight of anisole and/or a compound having structure B.

In another aspect, the rinse includes (i) approximately 30% by weight of acetic acid and (ii) preferably approximately 70% by weight of anisole and/or a compound having structure B.

In another aspect, the rinse includes (i) approximately 35% by weight of acetic acid and (ii) preferably approximately 65% by weight of anisole and/or a compound having structure B.

In another aspect, the rinse includes (i) between approximately 1% by weight and approximately 10% by weight of trifluoroacetic acid and/or difluoroacetic acid and (ii) between approximately 99% by weight and approximately 90% by weight of anisole and/or a compound having structure B.

In another aspect, the rinse includes (i) approximately 1% by weight of a halogenated acetic acid of structure A and (ii) preferably approximately 99% by weight of anisole and/or a compound having structure B. In a further aspect, the halogenated acetic acid of structure A is at least one of trifluoroacetic acid and difluoroacetic acid.

In another aspect, the rinse includes (i) approximately 2% by weight of a halogenated acetic acid of structure A and (ii) preferably approximately 98% by weight of anisole and/or a compound having structure B. In a further aspect, the halogenated acetic acid of structure A is at least one of trifluoroacetic acid and difluoroacetic acid.

In another aspect, the rinse includes (i) approximately 3% by weight of a halogenated acetic acid of structure A and (ii) approximately 97% by weight of anisole and/or a compound having structure B. In a further aspect, the halogenated acetic acid of structure A is at least one of trifluoroacetic acid and difluoroacetic acid.

In another aspect, the rinse includes (i) approximately 4% by weight of a halogenated acetic acid of structure A and (ii) preferably approximately 96% by weight of anisole and/or a compound having structure B. In a further aspect, the halogenated acetic acid of structure A is at least one of trifluoroacetic acid and difluoroacetic acid.

In another aspect, the rinse includes (i) approximately 5% by weight of a halogenated acetic acid of structure A and (ii) approximately 95% by weight of anisole and/or a compound having structure B. In a further aspect, the halogenated acetic acid of structure A is at least one of trifluoroacetic acid and difluoroacetic acid.

In another aspect, the rinse includes (i) approximately 6% by weight of a halogenated acetic acid of structure A and (ii) approximately 94% by weight of anisole and/or a compound having structure B. In a further aspect, the halogenated acetic acid of structure A is at least one of trifluoroacetic acid and difluoroacetic acid.

In another aspect, the rinse includes (i) approximately 7% by weight of a halogenated acetic acid of structure A and (ii) preferably approximately 93% by weight of anisole and/or a compound having structure B. In a further aspect, the halogenated acetic acid of structure A is at least one of trifluoroacetic acid and difluoroacetic acid.

In another aspect, the rinse includes (i) approximately 8% by weight of a halogenated acetic acid of structure A and (ii) approximately 92% by weight of anisole and/or a compound having structure B. In a further aspect, the halogenated acetic acid of structure A is at least one of trifluoroacetic acid and difluoroacetic acid.

In another aspect, the rinse includes (i) approximately 9% by weight of a halogenated acetic acid of structure A and (ii) approximately 91% by weight of anisole and/or a compound having structure B. In a further aspect, the halogenated acetic acid of structure A is at least one of trifluoroacetic acid and difluoroacetic acid.

In another aspect, the rinse includes (i) approximately 10% by weight of a halogenated acetic acid of structure A and (ii) preferably approximately 90% by weight of anisole and/or a compound having structure B. In a further aspect, the halogenated acetic acid of structure A is at least one of trifluoroacetic acid and difluoroacetic acid.

In another aspect, the disclosed subject matter relates to a method and process of using the rinse for removing an EPL and residual hardmask components (e.g., metals such as tin or titanium) from the edge and proximate surfaces of a wafer/substrate in lithographic processes, including in the manufacture of electronic devices.

In one aspect, the method and process include the step of removing the EPL and residual hardmask components (e.g., metals such as tin or titanium) by washing the wafer/substrate with the rinse. Thus, the method and process may be referred to as a method of cleaning a wafer or substrate comprising washing the wafer or substrate with the rinse. In a further aspect, the method and process include the step of treating a wafer/substrate edge and proximate surfaces with a masking agent to form an EPL. In yet a further aspect, the masking agent is a masking agent described and/or claimed in PCT/EP2018/056322. In yet a further aspect, the masking agent is a masking agent described and/or claimed in PCT/EP2018/056322 where the masking agent includes a polymer unit having one or more of the following formulae:

a.

b.

c.

, and d.

In another aspect, the method and process include one or more additional steps selected from the group of: (a) heating the masking agent to form the EPL; (b) applying a hardmask composition to the substrate and the EPL; (c) removing at least a portion of the hardmask composition that is in contact with the EPL by rinsing the hardmask composition and EPL with an EBR and/or BR material; (d) heating the hardmask composition to form a hardmask; and (e) performing at least one post applied bake.

In another aspect, the method and process includes sequentially performing, without intervening steps, the steps of (i) treating a wafer/substrate edge and proximate surfaces with a masking agent; (ii) heating the applied masking agent to form an EPL; (iii) applying a hardmask composition to the substrate and the EPL; (iv) removing at least a portion of the hardmask composition that is in contact with the EPL by rinsing the hardmask composition and EPL with an EBR and/or BR material; (v) heating the hardmask composition to form a hardmask; (vi) removing the EPL and residual hardmask components by washing the wafer/substrate with the rinse; and (vii) optionally performing at least one post applied bake. Those skilled in the art will recognize that the sequential performance of the foregoing steps does not exclude performance of steps prior to or after the sequentially performed steps (e.g., supplying a wafer/substrate). In a further aspect, the masking agent is a masking agent described and/or claimed in PCT/EP2018/056322. In yet a further aspect, the masking agent is a masking agent described and/or claimed in PCT/EP2018/056322 where the masking agent includes a polymer unit having one or more of the following formulae:

a.

b.

c.

, and d.

.

In another aspect, the disclosed subject matter relates to the method and process of applying and removing an edge protection layer and residual hardmask components (e.g., metals such as tin or titanium) from a wafer/substrate that includes the steps of: (a) applying a masking agent on an edge and proximate surfaces of the wafer/substrate; (b) heating the masking agent to form the EPL on the edge and proximate surfaces of the wafer/substrate; (c) applying a hardmask composition to the wafer/substrate and the EPL; (d) removing at least a portion of the hardmask composition that is in contact with the EPL by rinsing the hardmask composition with at least one EBR and/or BR material; (e) heating the hardmask composition to form the hardmask; (f) washing the wafer/substrate with a rinse including (i) between approximately 15% by weight and approximately 35% by weight of acetic acid and (ii) between approximately 85% by weight and approximately 65% by weight of anisole and/or a compound having structure B; and (g) optionally performing at least one post applied baking step. In a further aspect, the masking agent is a masking agent described and/or claimed in PCT/EP2018/056322. In yet a further aspect, the masking agent is a masking agent described and/or claimed in PCT/EP2018/056322 where the masking agent includes a polymer unit having one or more of the following formulae:

a.

, b.

, c.

, and d.

.

In another aspect, the disclosed subject matter relates to the method and process of applying and removing an edge protection layer and residual hardmask components (e.g., metals such as tin or titanium) from a wafer/substrate that includes the steps of: (a) applying a masking agent on an edge and proximate surfaces of the wafer/substrate; (b) heating the masking agent to form the EPL on the edge and proximate surfaces of the wafer/substrate; (c) applying a hardmask composition to the wafer/substrate and the EPL; (d) removing at least a portion of the hardmask composition that is in contact with the EPL by rinsing the hardmask composition with at least one EBR and/or BR material; (e) heating the hardmask composition to form the hardmask; (f) washing the wafer/substrate with a rinse including (i) between approximately 1% by weight and approximately 10% by weight of halogenated acetic acid of structure A and (ii) between approximately 99% by weight and approximately 90% by weight of anisole and/or a compound having structure B; and (g) optionally performing at least one post applied baking step. In a further aspect, the masking agent is a masking agent described and/or claimed in PCT/EP2018/056322. In yet a further aspect, the masking agent is a masking agent described and/or claimed in PCT/EP2018/056322 where the masking agent includes a polymer unit having one or more of the following formulae:

a.

, b.

, c.

, and d.

.

In a further aspect, the halogenated acetic acid of structure A is at least one of trifluoroacetic acid and difluoroacetic acid.

BRIEF DESCRIPTION OF THE DRAWINGS

The accompanying drawings, which are included to provide a further understanding of the disclosed subject matter and are incorporated in and constitute a part of this specification, illustrate embodiments of the disclosed subject matter and together with the description serve to explain the principles of the disclosed subject matter. In the drawings:

FIGS. 2a-f illustrates a schematic representation of one embodiment of a method and process for using the rinse solutions disclosed herein. In FIG. 2a, a masking agent is applied onto an edge of a substrate. In FIG. 2b, the masking agent is heated to form an EPL. In FIG. 2c, a hardmask composition is applied onto the substrate and the EPL. In FIG. 2d, the hardmask composition and EPL are rinsed with an EBR to remove at least a portion of the hardmask composition that is in contact with the EPL. In FIG. 2e, the hardmask composition is heated to form a hardmask. In FIG. 2f, the EPL and residual hardmask components (e.g., metals such as tin or titanium) are removed from the edge of a wafer/substrate with the rinse;

DEFINITIONS

Unless otherwise stated, the following terms used in the specification and claims shall have the following meanings for this application.

In this application, the use of the singular includes the plural, and the words "a," "an" and "the" mean "at least one" unless specifically stated otherwise. Furthermore, the use of the term "including," as well as other forms such as "includes" and "included," is not limiting. Also, terms such as "element" or "component" encompass both elements or components including one unit and elements or components that include more than one unit, unless specifically stated otherwise. As used herein, the conjunction "and" is intended to be inclusive and the conjunction "or" is not intended to be exclusive, unless otherwise indicated. For example, the phrase "or, alternatively" is intended to be exclusive. As used herein, the term "and/or" refers to any combination of the foregoing elements including using a single element.

The term "about" or "approximately," when used in connection with a measurable numerical variable, refers to the indicated value of the variable and to all values of the variable that are within the experimental error of the indicated value (e.g., within the 95% confidence limit for the mean) or within percentage of the indicated value (e.g., +10%, +5%), whichever is greater.

As used herein, "$C_{x-y}$" designates the number of carbon atoms in a chain. For example, $C_{1-6}$ alkyl refers to an alkyl chain having a chain of between 1 and 6 carbons (e.g., methyl, ethyl, propyl, butyl, pentyl and hexyl). Unless specifically stated otherwise, the chain can be linear or branched.

Unless otherwise indicated, "alkyl" refers to hydrocarbon groups which can be linear, branched (e.g., methyl, ethyl, propyl, isopropyl, tert-butyl and the like), cyclic (e.g., cyclohexyl, cyclopropyl, cyclopentyl and the like) or multicyclic (e.g., norbornyl, adamantly and the like). These alkyl moieties may be substituted or unsubstituted.

"Halogenated alkyl" refers to a linear, cyclic or branched saturated alkyl group as defined above in which one or more of the hydrogens has been replaced by a halogen (e.g., F, Cl, Br and I). Thus, for example, a fluorinated alkyl (a.k.a. "fluoroalkyl") refers to a linear, cyclic or branched saturated alkyl group as defined above in which one or more of the hydrogens has been replaced by fluorine (e.g., trifluoromethyl, pefluoroethyl, 2,2,2-trifluoroethyl, prefluoroisopropyl, perfluorocyclohexyl and the like). Such haloalkyl moieties (e.g., fluoroalkyl moieties), if not perhalogenated/multihalogentated, may be unsubstituted or further substituted.

"Alkoxy" (a.k.a. "alkyloxy") refers to an alkyl group as defined above which is attached through an oxy (—O—) moiety (e.g., methoxy, ethoxy, propoxy, butoxy, 1,2-isopropoxy, cyclopentyloxy, cyclohexyloxy and the like). These alkoxy moieties may be substituted or unsubstituted.

"Alkyl carbonyl" refers to an alkyl group as defined above which is attached through a carbonyl group (—C(=O)—)) moiety (e.g., methylcarbonyl, ethylcarbonyl, propylcarbonyl, buttylcarbonyl, cyclopentylcarbonyl and the like). These alkyl carbonyl moieties may be substituted or unsubstituted.

"Halo" or "halide" refers to a halogen (e.g., F, Cl, Br and I).

"Hydroxy" (a.k.a. "hydroxyl") refers to an —OH group.

Unless otherwise indicated, the term "substituted" when referring to an alkyl, alkoxy, fluorinated alkyl and the like refers to one of these moieties which also contains one or more substituents including, but not limited to, the following substituents: alkyl, substituted alkyl, unsubstituted aryl, substituted aryl, alkyloxy, alkylaryl, haloalkyl, halide, hydroxy, amino and amino alkyl. Similarly, the term "unsubstituted" refers to these same moieties where no substituents apart from hydrogen are present.

The section headings used herein are for organizational purposes and are not to be construed as limiting the subject matter described. All documents, or portions of documents, cited in this application, including, but not limited to, patents, patent applications, articles, books, and treatises, are hereby expressly incorporated herein by reference in their entirety for any purpose. In the event that any of the incorporated literature and similar materials defines a term in a manner that contradicts the definition of that term in this application, this application controls.

DETAILED DESCRIPTION

It is to be understood that both the foregoing general description and the following detailed description are illustrative and explanatory, and are not restrictive of the subject matter, as claimed. The objects, features, advantages and ideas of the disclosed subject matter will be apparent to those skilled in the art from the description provided in the specification, and the disclosed subject matter will be readily practicable by those skilled in the art on the basis of the description appearing herein. The description of any "preferred embodiments" and/or the examples which show preferred modes for practicing the disclosed subject matter are included for the purpose of explanation and are not intended to limit the scope of the claims.

It will also be apparent to those skilled in the art that various modifications may be made in how the disclosed subject matter is practiced based on described aspects in the specification without departing from the spirit and scope of the disclosed subject matter disclosed herein.

As set forth above, the disclosed subject matter relates to a rinse that includes (i) acetic acid and/or halogenated acetic acid of structure A and (ii) anisole and/or derivatives of anisole (i.e., compounds other than anisole falling with the scope of structure B) that can be utilized for removing an EPL and residual hardmask components (e.g., metals such as tin or titanium) from the edge and proximate surfaces of a wafer/substrate surface in lithographic processes.

Rinse Components

The rinse includes (i) acetic acid (CAS 64-19-7) or halogenated acetic acid of structure A and (ii) anisole (CAS 100-66-3; a.k.a. methoxybenzene or methyl phenyl ether) and/or derivatives of anisole in varying concentrations. The rinse includes, for example, between approximately 15% by weight to approximately 35% by weight of acetic acid and between approximately 85% by weight and approximately 65% by weight of anisole and/or derivatives of anisole. The rinse can alternatively include between approximately 1% by weight and approximately 10% by weight of halogenated acetic acid of structure A and between approximately 99% by weight and approximately 90% by weight of anisole and/or a compound having structure B.

Those skilled in the art will recognize that quantities of acetic acid exceeding approximately 35% by weight or halogenated acetic acid of structure exceeding approximately 10% by weight of A will generally have a deleterious effect on a wafer/substrate and/or other features imprinted thereon despite such compositions being effective at removing an removing an EPL and residual hardmask components. However, to the extent that a wafer/substrate is amenable to exposure to higher weight percentages of acetic acid or halogenated acetic acid of structure A, the disclosed rinse can include amounts of acetic acid exceeding approximately 35% by weight or amounts of halogenated acetic acid of structure A exceeding approximately 10% by weight.

Those skilled in the art will also readily recognize that the amounts of acetic acid and/or halogenated acetic acid of structure A with anisole and/or the derivatives of anisole can be adjusted within these ranges and that all such combinations thereof fall within the scope of the disclosed subject matter and the combined relative amounts of acetic acid and/or halogenated acetic acid of structure A with anisole and/or derivatives of anisole do not necessarily need to equal 100% by weight. In one embodiment, for example, the rinse includes approximately 20% by weight of acetic acid and approximately 75% by weight of anisole and/or the derivatives of anisole. In another embodiment, the rinse includes approximately 30% by weight of acetic acid and approximately 70% by weight of anisole and/or the derivatives of anisole. In yet another embodiment, the rinse can include approximately 32.5% by weight of acetic acid and approximately 67% by weight of anisole and/or the derivatives of anisole. In yet another embodiment, the rinse can include approximately 18.5% by weight of acetic acid and approximately 75% by weight of anisole and/or the derivatives of anisole. In further embodiments, the rinse can include approximately 2% by weight of halogenated acetic acid of structure A and approximately 98% by weight of anisole and/or the derivatives of anisole. In further embodiments, the rinse can include approximately 4% by weight of halogenated acetic acid of structure A and approximately 96% by weight of anisole and/or the derivatives of anisole. In yet further embodiments, the rinse can include approximately 10% by weight of halogenated acetic acid of structure A and approximately 90% by weight of anisole and/or the derivatives of anisole.

Those skilled in the art will further recognize that rinses including between "approximately 15% by weight and approximately 35% by weight" of acetic acid or "approximately 1% by weight and approximately 10% by weight" of halogenated acetic acid of structure A are not strictly bounded ranges and can includes amounts of acetic acid and/or halogenated acetic acid of structure A somewhat outside of those ranges. In one embodiment, for example, a rinse that includes between "approximately 15% by weight and approximately 35% by weight" of acetic acid and/or "approximately 1% by weight and approximately 10% by weight" of halogenated acetic acid of structure A can include ±10% of the weight percent of acetic acid and/or halogenated acetic acid of structure A. Thus, an embodiment of the rinse including "approximately 15% by weight" of acetic acid can include between 13.5% by weight and 16.5% by weight of acetic acid. An embodiment of the rinse including "approximately 20% by weight of acetic acid" can include between 18% by weight and 22% by weight of acetic acid. An embodiment of the rinse including "approximately 30% by weight" of acetic acid can include between 27% by weight and 33% by weight of acetic acid. Similarly, an embodiment of the rinse including "approximately 2% by weight" of halogenated acetic acid of structure A can include between 1.8% by weight and 2.2% by weight of halogenated acetic acid of structure A. An embodiment of the rinse including "approximately 4% by weight" of halogenated acetic acid of structure A can include between 3.6% by weight and 4.4% by weight of halogenated acetic acid of structure A. An embodiment of the rinse including "approximately 10% by weight" of halogenated acetic acid of structure A can include between 9% by weight and 11% by weight of halogenated acetic acid of structure A.

In one embodiment, for example, a rinse that includes between "approximately 15% by weight and approximately 35% by weight" of acetic acid and/or "approximately 1% by weight and approximately 10% by weight" of halogenated acetic acid of structure A can include ±5% of the weight percent of acetic acid and/or halogenated acetic acid of structure A. Thus, an embodiment of the rinse including "approximately 15% by weight" of acetic acid can include between 14.25% by weight and 15.75% by weight of acetic acid. An embodiment of the rinse including "approximately 20% by weight" of acetic acid can include between 19% by weight and 21% by weight of acetic acid. An embodiment of the rinse including "approximately 30% by weight" of acetic acid can include between 28.5% by weight and 31.5% by weight of acetic acid. Similarly, an embodiment of the rinse including "approximately 2% by weight" of halogenated acetic acid of structure A can include between 1.9% by weight and 2.1% by weight of halogenated acetic acid of structure A. An embodiment of the rinse including "approximately 4% by weight" of halogenated acetic acid can include between 3.8% by weight and 4.2% by weight of halogenated acetic acid of structure A. An embodiment of the rinse including "approximately 10% by weight" of halogenated acetic acid of structure A can include between 9.5% by weight and 10.5% by weight of halogenated acetic acid of structure A.

Those skilled in the art will further recognize that rinses including between "approximately 85% by weight and approximately 65% by weight" or "approximately 99% by weight and approximately 90% by weight" of anisole and/or derivatives of anisole are not strictly bounded ranges and can include amounts of anisole and/or derivatives of anisole somewhat outside of those ranges. In one embodiment, for example, a rinse that includes between "approximately 85% by weight and approximately 65% by weight" of anisole and/or derivatives of anisole can include ±10% of the weight percent of anisole and/or derivatives of anisole. Thus, an embodiment of the rinse including "approximately 85% by weight" of anisole and/or derivatives of anisole can include between 93.5% by weight and 76.5% by weight of anisole and/or derivatives of anisole. An embodiment of the rinse including "approximately 80% by weight" of anisole and/or derivatives of anisole can include between 88% by weight and 72% by weight of anisole and/or derivatives of anisole. An embodiment of the rinse including "approximately 70% by weight" of anisole and/or derivatives of anisole can include between 77% by weight and 63% by weight of anisole and/or derivatives of anisole.

In another embodiment, for example, a rinse that includes between "approximately 85% by weight and approximately 65% by weight" of anisole and/or derivatives of anisole can include ±5% of the weight percent of anisole and/or derivatives of anisole. Thus, an embodiment of the rinse including "approximately 85% by weight" of anisole and/or derivatives of anisole can include between 89.25% by weight and 80.75% by weight of anisole and/or derivatives of anisole. An embodiment of the rinse including "approximately 80% by weight" of anisole and/or derivatives of anisole can include between 84% by weight and 76% by weight of anisole and/or derivatives of anisole. An embodiment of the rinse including "approximately 70% by weight" of anisole and/or derivatives of anisole can include between 76.5% by weight and 73.5% by weight of anisole and/or derivatives of anisole.

In a further embodiment, the rinse consists essentially of (i) acetic acid and/or halogenated acetic acid of structure and (ii) anisole and/or derivatives of anisole in varying concentrations. In such an embodiment, the combined amounts of acetic acid and/or halogenated acetic acid of structure A with anisole and/or derivatives of anisole do not equal 100% by weight, and can include other ingredients (e.g., additional solvent(s), including water, common additives and/or impurities) that do not materially change the effectiveness of the rinse. Thus, in other embodiments, the rinse can include acetic acid and/or halogenated acetic acid of structure A acid having different quantities of water. In one such embodiment, the rinse can include acetic acid and/or halogenated acetic acid of structure A having in excess of 1% of water by weight. In another such embodiment, the rinse can include anhydrous (a.k.a. glacial) acetic acid (i.e., acetic acid having less that 1% by weight of water). Such embodiments can also, for example, include different technical grades (e.g., reagent grade, trace grade, ultratrace grade, electronic grade, HPLC grade, etc.) of acetic acid, anhydrous/glacial acetic acid and/or halogenated acetic acid of structure A with varying quantities of impurities.

In another embodiment, the rinse consists of (i) acetic acid and/or halogenated acetic acid of structure A and (ii) anisole and/or derivatives of anisole in varying concentrations. In such an embodiment, the combined amounts of acetic acid and/or halogenated acetic acid of structure A and anisole and/or derivatives of anisole equal approximately 100% by weight but may include other small and/or trace amounts of impurities that are present in such small quantities that they do not materially change the effectiveness of the rinse. For example, in one such embodiment, the rinse can contain 2% by weight or less of total impurities and/or other ingredients (e.g., additional solvent(s), including water). In another embodiment, the rinse can contain 1% by weight or less than of total impurities and/or other ingredients (e.g., additional solvent(s), including water). In a further embodiment, the rinse can contain 0.05% by weight or less than of total impurities and/or other ingredients (e.g., additional solvent(s), including water). Such embodiments can, for example, include anhydrous/glacial acetic acid. Such embodiments can also, for example, include different technical grades (e.g., reagent grade, trace grade, ultratrace grade, electronic grade, HPLC grade, etc.) of acetic acid, anhydrous/glacial acetic acid and/or halogenated acetic acid of structure A with varying quantities of impurities. Such embodiments can also include, for example, trace amounts of metal impurities present at quantities well-below 0.05% by weight (e.g., at the ppb level).

Those skilled in the art will further recognize that the halogenated acetic acid of structure A that can be used in the disclosed rinse include (i) those halogenated acetic acid compounds of structure A where $R_1$ and $R_2$ are each hydrogen and $R_3$ is a halogen selected from among fluorine, bromine, iodine and chlorine, (ii) those halogenated acetic acid compounds of structure A where two or more of $R_1$, $R_2$ and $R_3$ are the same halogen selected from among fluorine, bromine, iodine and chlorine, and (iii) those halogenated acetic acid compounds of structure A where two or more of $R_1$, $R_2$ and $R_3$ are a different halogen selected from among fluorine, bromine, iodine and chlorine. Examples of such compounds include, but are not limited to, fluoroacetic acid, iodoacetic acid, bromo acetic acid, chloroacetic acid, difluoracetic acid, trifluoracetic acid, diiodoracetic acid, triiodoracetic acid, dibromoracetic acid, tribromoracetic acid, dichlororacetic acid, trichlororacetic acid as well as halogenated acetic acids including two or more different halogens (e.g., where two or more of $R_1$, $R_2$ and $R_3$ in structure A are each a different halogen). The rinse can further include a mixture of two or more halogenated acetic acids of structure A.

Those skilled in the art will further recognize that derivatives of anisole, including variously substituted anisole compounds, can also be used in the disclosed rinse. In this regard, the disclosed rinse includes mixtures of acetic acid or halogenated acetic acid of structure A and anisole and/or derivatives of anisole of structure B:

Structure B wherein each of $R_a$, $R_b$, $R_c$, $R_d$, $R_e$, $R_f$, $R_g$ and $R_h$ may independently be hydrogen, a substituted or an unsubstituted alkyl group, a substituted or an unsubstituted halogenated alkyl group, a substituted or an unsubstituted alkyl carbonyl group, a halogen, and a hydroxy group as described above. Examples of specific derivatives of anisole suitable for use in the described and/or claimed rinse include, but are not limited to, halogenated anisole compounds (e.g., where one or more of $R_a$, $R_b$, $R_e$, $R_d$ and $R_e$ is each independently a fluorine, iodine, bromine or chlorine).

EPL Masking Agent

The disclosed rinses are suitable for removing an EPL formed on the edge and proximate surfaces of a wafer/substrate. In one embodiment, the disclosed rinses are adapted for removing an EPL formed from the masking agents or compositions described and/or claimed in PCT/EP2018/056322, including those having the following components:

a. a polymer including a unit having structure (I):

wherein
X is selected from the group of —SO$_2$—, —C(=O)— and —O—;
A is a direct bond or A is selected from the group of structure (II):

R$_1$, R$_2$, R$_3$, R$_4$ and R$_5$ are each independently selected from the group of H, halo, (C$_{1-3}$) alkyl, (C$_{1-3}$) fluorinated alkyl, hydroxy, (C$_{1-3}$) alkoxy, and (C$_{1-3}$) alkyl carbonyl; and
q, r, s and t are each independently selected from the group consisting of 0, 1, 2, 3 and 4; and
b. an organic solvent,
wherein the polymer has an average molecular weight of less than 50000.

In a further embodiment, where the EPL is formed from the compositions disclosed and/or claimed in PCT/EP2018/056322, the rinses are particularly effective where the polymer unit having structure (I) shown above includes one of, and preferably is one of:

When applied, the EPL can for example be applied at a width of at least approximately 0.5 mm. Alternatively, the EPL can be applied at a width of at least approximately 0.75 mm. Further, the EPL can be applied at a width of not more than approximately 2.0 mm. Alternatively, the EPL can be applied at a width of not more than approximately 1.0 mm.

Figure 1:
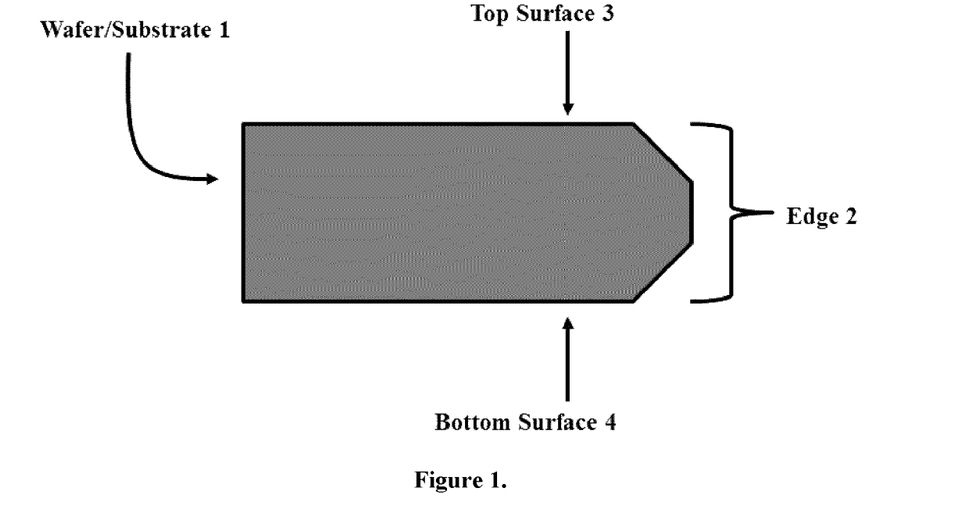
FIG. 1 illustrates a wafer/substrate upon which an EPL is applied.

Referring to FIG. 1, when the EPL is applied to a wafer/substrate 1, the EPL is applied to the edge 2 of the wafer/substrate, as well as on one or more surfaces proximate to the edge of the wafer/substrate (i.e., the top surface 3 and/or bottom surface 4) of the wafer/substrate. Thus, the EPL can be positioned to cover the edge of the substrate and to extend over the front and/or backside of the substrate. For example, the EPL can be applied on the proximate surfaces of the edge and extend from approximately 0.5 mm to approximately 2.0 mm in width on the top surface of the wafer/substrate, over the edge and then approximately 2.5 mm in width on the backside of the wafer/substrate edge.

Hardmask

As noted above, the disclosed rinses advantageously provide for the simultaneous removal of an applied EPL and remaining hardmask components from the edge and proximate surfaces of the wafer/substrate (e.g., where the hardmask has penetrated or undercut the EPL). Examples of residual hardmask components that can be removed with the disclosed rinses include the ingredients of both metal hardmask compositions and metal oxide photoresist compositions used in lithographic manufacturing processes. Suitable metal hardmask and metal oxide photoresist compositions include, but are not limited to, those described in U.S. Pat. Nos. 9,315,636; 8,568,958, 9,201,305; 9,296,922; 9,409,793; and 9,499,698 and U.S. Patent Application No. 62/437,449 (filed Dec. 21, 2016) and Ser. No. 14/978,232 (filed Dec. 22, 2015), which are hereby incorporated herein by reference in their entireties. The hardmask components removed or that can be removed by the disclosed rinses include different metals, including tin, titanium, zirconium, tantalum, lead, antimony, thallium, indium, ytterbium, gallium, hafnium, aluminum, magnesium, molybdenum, germanium, iron, cobalt, nickel, copper, zinc, gold, silver, cadmium, tungsten and platinum.

The rinses are effective at removing residual hardmask components regardless of the methodology used for applying the hardmask. In this regard, any of a variety of techniques can be used to apply the hardmask composition onto the wafer/substrate surface to form the hardmask in the disclosed methods/processes. Suitable techniques include, but are not limited to, spin-on coating, chemical vapor deposition (CVD) and atomic layer deposition (ALD). When spin coating is utilized, preferably at least one casting solvent is used, wherein the solvent used should not deleteriously affect the EPL. Accordingly, suitable casting solvents for the hardmask composition include, but are not limited to, propylene glycol monomethyl ether acetate (PGMEA), propylene glycol methyl ether (PGME), ethyl lactate, methoxyethanol, ethoxypropanol, ethoxyethanol, 1-pentanol, 4-methyl-2-pentanol and mixtures thereof.

In the disclosed methods/processes any of a variety of techniques can be used to remove a portion of the hardmask composition that is in contact with the EPL. It would be understood by those skilled in the art that removal of a portion of the hardmask composition that is in contact with the EPL should not deleteriously affect that part of the hardmask composition that is not in contact with the EPL. Suitable techniques include, but are not limited to, chemical mechanical polishing (CMP), plasma etching, and wet etching. When wet etching is utilized, any of a variety of solvents (such as EBRs) can be used provided that the solvent does not deleteriously affect the EPL or hardmask. Suitable EBRs include, but are not limited to, PGMEA, PGME, ethyl lactate, methoxyethanol, ethoxypropanol, ethoxyethanol, 1-pentanol, 4-methyl-2-pentanol and mixtures thereof.

In the disclosed methods/processes the hardmask composition can be treated by a variety of techniques to form the hardmask. For example, the hardmask composition can be treated by heating at a temperature between approximately 150° C. and approximately 450° C. and/or for a time between approximately 60 seconds and approximately 120 seconds.

Typical electronic devices that can be manufactured using the compositions and methods of the disclosed subject matter include, but are not limited to, computer chips, integrated circuits, and semiconductor devices.

EXAMPLES

Reference will now be made to more specific embodiments of the present disclosure and experimental results that provide support for such embodiments. The examples are given below to more fully illustrate the disclosed subject matter and should not be construed as limiting the disclosed subject matter in any way.

It will be apparent to those skilled in the art that various modifications and variations can be made in the disclosed subject matter and specific examples provided herein without departing from the spirit or scope of the disclosed subject matter. Thus, it is intended that the disclosed subject matter, including the descriptions provided by the following examples, covers the modifications and variations of the disclosed subject matter that come within the scope of any claims and their equivalents.

Materials and Methods:

MI-HM 082 is a metal hardmask composition containing titanium available from EMD Performance Material Corp.

EPL 003 is a polysulfone in anisole available from EMD performance Materials Corp.

U98 polymer is a high carbon-containing polymer available from EMD Performance Materials Corp.

ArF Thinner is a 70/30 (by weight) mixture of PGMEA/PGME available from EMD Performance Materials Corp.

Metal content was determined by ICP-MS on an Elan DRC II using the following operating parameters:

| Condition | Setting |
| --- | --- |
| Ti 48 | DRc Mode |
| Aqueous Standard | 0.2, 1.0, 2.5, 5.0 and 10.0 ppb |
| Replicates Scans | 3 |
| Sweeps/Reading | 5 |
| Scan Mode | Peak Hopping |
| Dwell Time | 50 ms |
| Integration Time | 250 ms |
| DRC Neb Flow | 1.12 mL/minute |
| DRC Gas | 0.1 mL/minute |
| ICP Power | 1600 watts |
| Plasma Flow | 19 L/minute |
| Aux Flow | 1.2 mL/minute |
| Detector Mode | Dual |
| Sample Flush Time | 70 seconds |
| Read Delay | 20 seconds |
| Sample Prep. | 1 to 10 in deionized water |
| Report Units | Parts-per-billion (ppb) |

Metal Hard Mask ("MHM") Formulation: In order to evaluate the effectiveness of removing any remaining residual components of a hardmask, an MHM formulation containing a masking agent for application to a wafer/substrate (the "MHM formulation") was prepared by combining MHM 082 (2514.285 g), triethanolamine (314.285 g), and U-98 polymer (78.57 g) were dissolved in ArF Thinner (12,092.857 g) and filtered through 0.2 micron filter.

Example 1: The MHM formulation was spin coated (7500 rpm) without any bake on a wafer and the wafer was soaked in 100% anisole on a lab hotplate until all the film was removed. The wafer was then washed with an acid solution of HCl and hydrogen peroxide for 6 minutes that was prepared by adding approximately 30.4 g of water to a flask to which 35.7 g of hydrogen peroxide (30%) and 33.9 g of HCl (37%) were added with stirring (approximately 1 hour). The titanium content of the extracted solution was determined by ICP-MS to be 89.14 ppb as described above.

Example 2: The MHM formulation was spin coated (7500 rpm) without any bake on a wafer and the wafer was soaked in a mixture of 5% (by weight) of acetic acid and 95% (by weight) of anisole on lab hotplate until all the film was removed. The wafer was then washed with an acid solution of HCl and hydrogen peroxide for 6 minutes that was prepared by adding approximately 30.4 g of water to a flask to which 35.7 g of hydrogen peroxide (30%) and 33.9 g of HCl (37%) were added with stirring (approximately 1 hour). The titanium content of the extracted solution was determined by ICP-MS to be 89.14 ppb as described above.

Example 3: The MHM formulation was spin coated (7500 rpm) without any bake on a wafer and the wafer was soaked in a mixture of 10% (by weight) of acetic acid and 90% (by weight) of anisole on lab hotplate until all the film was removed. The wafer was then washed with an acid solution of HCl and hydrogen peroxide for 6 minutes that was prepared by adding approximately 30.4 g of water to a flask to which 35.7 g of hydrogen peroxide (30%) and 33.9 g of HCl (37%) were added with stirring (approximately 1 hour). The titanium content of the extracted solution was determined by ICP-MS to be 90.33 ppb as described above.

Example 4: The MHM formulation was spin coated (7500 rpm) without any bake on a wafer and the wafer was soaked in a mixture of 20% (by weight) of acetic acid and 80% (by weight) of anisole on lab hotplate until all the film was removed. The wafer was then washed with an acid solution of HCl and hydrogen peroxide for 6 minutes that was prepared by adding approximately 30.4 g of water to a flask to which 35.7 g of hydrogen peroxide (30%) and 33.9 g of HCl (37%) were added with stirring (approximately 1 hour). The titanium content of the extracted solution was determined by ICP-MS to be 58.73 ppb as described above.

Example 5: The MHM formulation was spin coated (7500 rpm) without any bake on a wafer and the wafer was soaked in a mixture of 30% (by weight) of acetic acid and 70% (by weight) of anisole on lab hotplate until all the film was removed. The wafer was then washed with an acid solution of HCl and hydrogen peroxide for 6 minutes that was prepared by adding approximately 30.4 g of water to a flask to which 35.7 g of hydrogen peroxide (30%) and 33.9 g of HCl (37%) were added with stirring (approximately 1 hour). The titanium content of the extracted solution was determined by ICP-MS to be 58.84 ppb as described above.

Example 6: The MHM formulation was spin coated (7500 rpm) without any bake on a wafer and the wafer was soaked in a mixture of 2% (by weight) of trifluoro acetic acid and 98% (by weight) of anisole on lab hotplate until all the film was removed. The wafer was then washed with an acid solution of HCl and hydrogen peroxide for 6 minutes that was prepared by adding approximately 30.4 g of water to a flask to which 35.7 g of hydrogen peroxide (30%) and 33.9 g of HCl (37%) were added with stirring (approximately 1 hour). The titanium content of the extracted solution was determined by ICP-MS to be 49.2 ppb as described above.

Example 7: The MHM formulation was spin coated (7500 rpm) without any bake on a wafer and the wafer was soaked in a mixture of 4% (by weight) of trifluoro acetic acid and 96% (by weight) of anisole on lab hotplate until all the film was removed. The wafer was then washed with an acid solution of HCl and hydrogen peroxide for 6 minutes that was prepared by adding approximately 30.4 g of water to a flask to which 35.7 g of hydrogen peroxide (30%) and 33.9 g of HCl (37%) were added with stirring (approximately 1 hour). The titanium content of the extracted solution was determined by ICP-MS to be 50.89 ppb as described above.

Example 8: The MHM formulation was spin coated (7500 rpm) without any bake on a wafer and the wafer was soaked in a mixture of 10% (by weight) of trifluoro acetic acid and 90% (by weight) of anisole on lab hotplate until all the film was removed. The wafer was then washed with an acid solution of HCl and hydrogen peroxide for 6 minutes that was prepared by adding approximately 30.4 g of water to a flask to which 35.7 g of hydrogen peroxide (30%) and 33.9 g of HCl (37%) were added with stirring (approximately 1 hour). The titanium content of the extracted solution was determined by ICP-MS to be 49.13 ppb as described above.

Results

As shown in Table 1 below, a significant and unexpected drop in residual quantities of the applied hardmask (i.e., the amount of metal residue) is observed for rinses including between approximately 15% by weight and 35% by weight of acetic acid and between approximately 85% by weight and 65% by weight of anisole.

TABLE 1

| Acetic Acid/Anisole Ratio (wt %) | Metal Residue (ppb) |
|---|---|
| 0/100 | 89.14 |
| 5/95 | 89.14 |
| 10/90 | 90.33 |
| 20/80 | 58.73 |
| 30/70 | 58.84 |

As shown in Table 1, for example, the rinses including between approximately 20% by weight and 30% by weight of acetic acid and between approximately 80% by weight and 70% by weight of anisole unexpectedly reduced residual metal content by approximately 35% compared to other mixtures of acetic acid and anisole.

As shown in Table 2 below, the use of trifluoroacetic acid (i.e., a halogenated acetic acid compounds of structure A) also evidences a significant and unexpected drop in residual quantities of the applied hardmask (i.e., the amount of metal residue). In particular, drop in residual quantities of titanium was observed when using rinses including between approximately 1% by weight and 10% by weight of trifluoroacetic acid and between approximately 99% by weight and 90% by weight of anisole.

TABLE 2

| Trifluroacetic Acid/ Anisole Ratio (wt %) | Metal Residue (ppb) |
|---|---|
| 0/100 | 89.14 |
| 2/98 | 49.2 |
| 4/96 | 50.89 |
| 10/90 | 49.13 |

As shown in Table 2, for example, the rinses including between approximately 2% by weight and 10% by weight of trifluoroacetic acid and between approximately 98% by weight and 90% by weight of anisole were unexpectedly somewhat more effective at removing residual metal content than the acetic acid formulations on Table 1. In particular, the trifluoroacetic acid-containing rinses were demonstrated to be approximately 15% more effective at removing residual quantities of the applied hardmask based upon the average remaining metal residue (58.76 ppb) of the most effective acetic acid/anisole rinses of Table 1 (i.e., 20/80 and 30/70) compared to the average remaining metal residue (49.74 ppb) of the trifluoroacetic acid/anisole rinses of Table 2.

Although the disclosed and claimed subject matter has been described and illustrated with a certain degree of particularity, it is to be understood that the disclosure has been made only by way of example, and that numerous changes in the conditions and order of steps can be resorted to by those skilled in the art without departing from the spirit and scope of the disclosed and claimed subject matter.

What is claimed is:

1. A polymer-free rinse solution comprising
   (i) between approximately 15% by weight and approximately 35% by weight of acetic acid and
   (ii) between approximately 85% by weight and approximately 65% by weight of a compound having structure B:

wherein each of $R_a$, $R_b$, $R_c$, $R_d$, $R_e$, $R_f$, $R_g$ and $R_h$ may independently be hydrogen, a substituted or an unsubstituted ($C_{1-6}$) alkyl group, a substituted or an unsubstituted halogenated ($C_{1-6}$) alkyl group, a substituted or an unsubstituted ($C_{1-6}$) alkyl carbonyl group, a halogen, or a hydroxy group.

2. The rinse of claim 1, wherein each of $R_a$, $R_b$, $R_c$, $R_d$, $R_e$, $R_f$, $R_g$ and $R_h$ in structure B is hydrogen.

3. The polymer-free rinse solution of claim 1, wherein the rinse contains approximately 15% by weight of acetic acid.

4. The polymer-free rinse solution of claim 1, wherein the rinse contains approximately 20% by weight of acetic acid.

5. The polymer-free rinse solution of claim 1, wherein the rinse contains approximately 25% by weight of acetic acid.

6. The polymer-free rinse solution of claim 1, wherein the rinse contains approximately 30% by weight of acetic acid.

7. The polymer-free rinse solution of claim 1, wherein the rinse contains approximately 35% by weight of acetic acid.

8. A method of cleaning a wafer or substrate comprising: washing the wafer or substrate with a polymer-free rinse solution according to claim 1.

9. The method of claim 8, wherein each of $R_a$, $R_b$, $R_c$, $R_d$, $R_e$, $R_f$, $R_g$ and $R_h$ in structure B is hydrogen.

10. The method of claim 8, wherein the polymer-free rinse solution contains approximately 15% by weight of acetic acid and wherein each of $R_a$, $R_b$, $R_c$, $R_d$, $R_e$, $R_f$, $R_g$ and $R_h$ in structure B is hydrogen.

11. The method of claim 8, wherein the polymer-free rinse solution contains approximately 20% by weight of acetic acid and wherein each of $R_a$, $R_b$, $R_c$, $R_d$, $R_e$, $R_f$, $R_g$ and $R_h$ in structure B is hydrogen.

12. The method of claim 8, wherein the polymer-free rinse solution contains approximately 25% by weight of acetic acid and wherein each of $R_a$, $R_b$, $R_c$, $R_d$, $R_e$, $R_f$, $R_g$ and $R_h$ in structure B is hydrogen.

13. The method of claim 8, wherein the polymer-free rinse solution contains approximately 30% by weight of acetic acid and wherein each of $R_a$, $R_b$, $R_c$, $R_d$, $R_e$, $R_f$, $R_g$ and $R_h$ in structure B is hydrogen.

14. The method of claim 8, wherein the polymer-free rinse solution contains approximately 35% by weight of acetic acid and wherein each of $R_a$, $R_b$, $R_c$, $R_d$, $R_e$, $R_f$, $R_g$ and $R_h$ in structure B is hydrogen.

15. The method of claim 8, further comprising one or more steps selected from the group of:
   (a) applying a masking agent on an edge and at least one proximate surface of the wafer or substrate;
   (b) heating the applied masking agent to form the edge protection layer on the edge and at least one proximate surface of the wafer or substrate;
   (c) applying a hardmask composition to the wafer or substrate and the edge protection layer;
   (d) removing at least a portion of the applied hardmask composition that is in contact with the edge protection layer, wherein the removing comprises rinsing the hardmask composition with at least one edge bead remover material;
   (e) heating the applied hardmask composition to form the hardmask; and
   (f) performing at least one post applied bake.

16. A polymer-free rinse solution comprising
   (i) between approximately 1% by weight and approximately 10% by weight of halogenated acetic acid of structure A:

wherein $R_1$ and $R_2$ are independently hydrogen or a halogen and $R_3$ is a halogen; and
   (ii) between approximately 99% by weight and approximately 90% by weight of a compound having structure B:

wherein each of $R_a$, $R_b$, $R_c$, $R_d$, $R_e$, $R_f$, $R_g$ and $R_h$ may independently be hydrogen, a substituted or an unsubstituted $(C_{1-6})$ alkyl group, a substituted or an unsubstituted halogenated $(C_{1-6})$ alkyl group, a substituted or an unsubstituted $(C_{1-6})$ alkyl carbonyl group, a halogen, or a hydroxy group.

17. The polymer-free rinse solution of claim 16, wherein each of $R_a$, $R_b$, $R_c$, $R_d$, $R_e$, $R_f$, $R_g$ and $R_h$ in structure B is hydrogen.

18. The polymer-free rinse solution of claim 16, wherein in the halogenated acetic acid of structure A $R_1$ and $R_2$ are each hydrogen and $R_3$ is a halogen selected from among fluorine, bromine, iodine and chlorine.

19. The polymer-free rinse solution of claim 16, wherein in the halogenated acetic acid of structure A two or more of $R_1$, $R_2$ and $R_3$ is a halogen selected from among fluorine, bromine, iodine and chlorine.

20. The polymer-free rinse solution of claim 16, wherein the halogenated acetic acid of structure A is difluoroacetic acid and wherein each of $R_a$, $R_b$, $R_c$, $R_d$, $R_e$, $R_f$, $R_g$ and $R_h$ in structure B is hydrogen.

21. The polymer-free rinse solution of claim 16, wherein the halogenated acetic acid of structure A is trifluoroacetic acid and wherein each of $R_a$, $R_b$, $R_c$, $R_d$, $R_e$, $R_f$, $R_g$ and $R_h$ in structure B is hydrogen.

22. A method of cleaning a wafer or substrate comprising: washing the wafer or substrate with a polymer-free rinse solution according to claim 16.

23. The method of claim 22, further comprising one or more steps selected from the group of:
   (a) applying a masking agent on an edge and at least one proximate surface of the wafer or substrate;
   (b) heating the applied masking agent to form the edge protection layer on the edge and at least one proximate surface of the wafer or substrate;
   (c) applying a hardmask composition to the wafer or substrate and the edge protection layer;
   (d) removing at least a portion of the applied hardmask composition that is in contact with the edge protection layer, wherein the removing comprises rinsing the hardmask composition with at least one edge bead remover material;
   (e) heating the applied hardmask composition to form the hardmask; and
   (f) performing at least one post applied bake.

* * * * *